United States Patent
Emoto

(10) Patent No.: US 6,664,643 B2
(45) Date of Patent: Dec. 16, 2003

(54) SEMICONDUCTOR DEVICE AND METHOD FOR MANUFACTURING THE SAME

(75) Inventor: Yoshiaki Emoto, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/853,090

(22) Filed: May 10, 2001

(65) Prior Publication Data

US 2003/0045029 A1 Mar. 6, 2003

(30) Foreign Application Priority Data

May 11, 2000 (JP) ........................................ 2000-138771

(51) Int. Cl.⁷ ............................................... H01L 23/48
(52) U.S. Cl. ........................ 257/777; 257/738; 257/780; 257/779; 257/784; 257/723
(58) Field of Search ................................. 257/777, 738, 257/779–780, 784, 723

(56) References Cited

U.S. PATENT DOCUMENTS 6,147,401 A * 11/2000 Solberg ....................... 257/668

FOREIGN PATENT DOCUMENTS

| JP | 09-331599 | 12/1997 |
|---|---|---|
| JP | 10-005221 | 1/1998 |
| JP | 11-135537 | 5/1999 |

* cited by examiner

Primary Examiner—David L. Talbott
Assistant Examiner—Luan Thai
(74) Attorney, Agent, or Firm—Harness, Dickey & Pierce, P.L.C.

(57) ABSTRACT

In a stacked package in which semiconductor chips are stacked in layers, in order to mount the semiconductor chips without damaging the semiconductor chips even when an upper semiconductor chip has a greater size, a first chip 12 is mounted on an interposer substrate 11. A second chip 13 having a larger size than that of the first chip 12 is mounted on the rear surface of the first chip 12. The second chip 13 is wire-bonded with respect to the interposer substrate 11 by wires 15. A base member 17 is disposed outside the first chip 12. The first chip 12, the second chip 13 and the base member 17 are molded by a sealing resin 16. Solder balls 18 are provided on the opposite side of the chip-mounting side of the interposer substrate 11.

17 Claims, 2 Drawing Sheets

SEMICONDUCTOR DEVICE AND METHOD FOR MANUFACTURING THE SAME

TECHNICAL FIELD

The present invention relates to a semiconductor device and a method for manufacturing the same, and more particularly to a stacked package equipped with a plurality of semiconductor chips.

BACKGROUND TECHNOLOGY

In recent years, stacked packages in which semiconductor chips are stacked in layers have developed in order to promote miniaturization of semiconductor devices such as system LSIs. A stacked package has a structure shown in FIG. 3.

Referring to FIG. 3, a plurality of electrode pads are formed on an interposer substrate 31. A first semiconductor chip 32 is flip-chip mounted on the electrode pads. In other words, bumps 34 are provided at locations corresponding to the electrode pads on the surface of the first chip 32, and the bumps 34 and the electrode pads are electrically connected to one another such that the first chip 32 is flip-chip mounted on the interposer substrate 31.

A second semiconductor chip 33 that has a smaller measurement than that of the first chip 32 is mounted on the rear surface of the first chip 32 via an adhesive (not shown). The second chip 33 is wire-bonded to the interposer substrate 31 by wires 35. The first chip 32 and the second chip 33 are molded by a sealing resin 36.

On the opposite side of the chip-mounting side of the interposer substrate 31, solder balls 37 that are connection members to be used for mounting on a printed wire board are provided. The stacked package and the printed wiring board are electrically connected by the solder balls 37. In the structure shown in FIG. 3, the size of the second chip 33 is smaller than the size of the first chip 32. However, depending on structures of system LSIs, the size of the second chip 33 may be greater than the size of the first chip 32.

In such a case, when the second chip and the interposer substrate are wire-bonded, heating of the second chip becomes difficult, and an ultrasonic load may concentrate at areas where corner sections of the first chip contact the second chip, and excessive stresses may be generated at those sections. As a result, the second chip may be damaged.

The present invention has been made in view of the problems described above, and it is an object of the present invention to provide a semiconductor device and a method for manufacturing the same, in which, in a stacked package having semiconductor chips stacked in layers, wire-bonding can be conducted without damaging the semiconductor chips even when an upper semiconductor chip has a greater size.

DESCRIPTION OF THE INVENTION

In accordance with the present invention, a semiconductor device is characterized in comprising a first semiconductor chip mounted on a substrate, a second semiconductor chip mounted on the first semiconductor chip, the second semiconductor chip being larger than the first semiconductor chip, a base member that is disposed between the second semiconductor chip and the substrate, and a connection member disposed below the substrate, wherein the second semiconductor chip is supported by the base member.

According to the structure described above, the second semiconductor chip is supported by the base member. Therefore, when the second semiconductor chip and the substrates are wire-bonded, heat is sufficiently transferred to the second semiconductor chip through the base member, such that the heating of the second semiconductor chip is effectively conducted. Also, bonding pressure and ultrasonic energy that are applied to portions of the second semiconductor chip that extend outwardly from the first semiconductor chip can be alleviated. As a result, damage to the second semiconductor chip can be prevented.

In accordance with the present invention, a semiconductor device is characterized in comprising a first semiconductor chip mounted on a substrate, a second semiconductor chip mounted on the first semiconductor chip, the second semiconductor chip being larger than the first semiconductor chip, a filler layer that is provided between the second semiconductor chip and the substrate, and a connection member disposed below the substrate, wherein the second semiconductor chip is supported by the filler layer.

According to the structure described above, the second semiconductor chip is supported by the filler layer. Therefore, when the second semiconductor chip and the substrates are wire-bonded, heat is sufficiently transferred to the second semiconductor chip through the filler layer, such that the heating of the second semiconductor chip is effectively conducted. Also, bonding pressure and ultrasonic energy that are applied to portions of the second semiconductor chip that extend outwardly from the first semiconductor chip can be alleviated. As a result, damage to the second semiconductor chip can be prevented.

The present invention provides a method for manufacturing a semiconductor device, the method characterized in comprising the steps of mounting a first semiconductor chip on a substrate, mounting a base member outside the first semiconductor chip on the substrate, and mounting a second semiconductor chip that is larger than the first semiconductor chip on the first semiconductor chip, in a manner that the second semiconductor chip is supported by the base member.

According to the method described above, the second semiconductor chip is supported by the base member. Therefore, when the second semiconductor chip and the substrates are wire-bonded, heat is sufficiently transferred to the second semiconductor chip through the base member, such that the heating of the second semiconductor chip is effectively conducted. Also, bonding pressure and ultrasonic energy that are applied to portions of the second semiconductor chip that extend outwardly from the first semiconductor chip can be alleviated. As a result, damage to the second semiconductor chip can be prevented.

The present invention provides a method for manufacturing a semiconductor device, the method characterized in comprising the steps of mounting a first semiconductor chip on a substrate, mounting a second semiconductor chip that is larger than the first semiconductor chip on the first semiconductor chip, and providing a filler layer in a manner to support the second semiconductor chip.

According to the method described above, the second semiconductor chip is supported by the filler layer.

Therefore, when the second semiconductor chip and the substrates are wire-bonded, heat is sufficiently transferred to the second semiconductor chip through the filler layer, such that the heating of the second semiconductor chip is effectively conducted. Also, bonding pressure and ultrasonic energy that are applied to portions of the second semiconductor chip that extend outwardly from the first semiconductor chip can be alleviated. As a result, damage to the second semiconductor chip can be prevented.

BREIF DESCRIPTION OF THE DRAWINGS

BEST EMBODIMENTS OF THE PRESENT INVENTION

Embodiments of the present invention are described below in detail with reference to the accompanying drawings.

Figure 1:
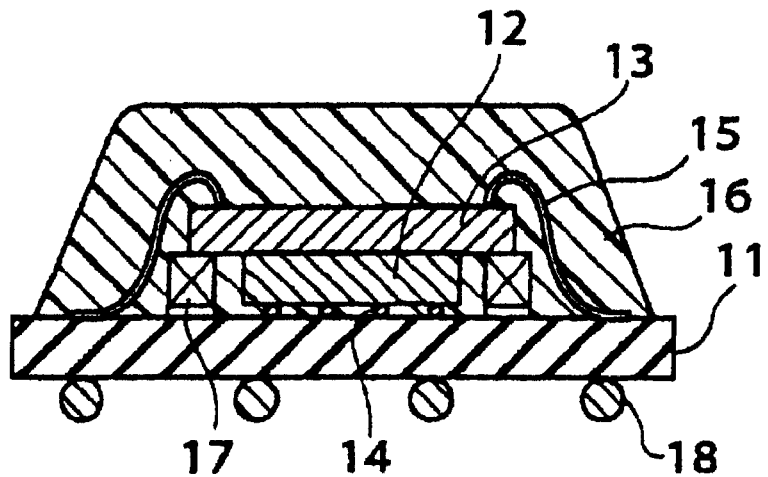
FIG. 1 shows a cross-sectional view of a structure of a semiconductor device in accordance with a first embodiment of the present invention.

FIG. 1 shows a cross-sectional view of a structure of a semiconductor device in accordance with a first embodiment of the present invention.

Referring to FIG. 1, a plurality of electrode pads is formed on an interposer substrate 11. A first semiconductor chip 12 is flip-chip mounted on the electrode pads. In other words, bumps 14 are provided at locations corresponding to the electrode pads on the surface of the first chip 12, and the bumps 14 and the electrode pads are electrically connected to one another such that the first chip 12 is flip-chip mounted on the interposer substrate 11.

A second semiconductor chip 13 that has a larger measurement than that of the first chip 12 is mounted on the rear surface of the first chip 12 via an adhesive (not shown). The second chip 13 is wire-bonded to the interposer substrate 11 by wires 15.

The base member 17 is disposed outside the first chip 12, and the base member 17 is mounted on the interposer substrate 11 through a thermosetting adhesive (not shown). In other words, the base member 17 is disposed at a location where it supports a proportion of the second chip 13 that extends beyond the first chip 12.

The base member 17 may preferably be formed from a material that has a small difference in the thermal expansion coefficient with respect to the first and second chips 12 and 13. For example, the base material 17 may be formed from a metal such as an alloy.

The base member 17 may be in a frame shape that surrounds the first chip 12, or a column-like member that is disposed at a location where it can support the second chip 13. In order to securely support the second chip 13, an area of the base member 17 to be located may preferably be generally the same as that of the first chip 12 or greater.

The first chip 12, the second chip 13 and the base member 17 are molded by a sealing resin 16. On the opposite side of the chip-mounting side of the interposer substrate 11 are provided solder balls 18 that are connection members to be used for mounting on a printed wire board. The stacked package and the printed wiring board are electrically connected by the solder balls 18.

Next, a method for manufacturing the semiconductor device having the structure described above is described below.

First, the first chip 12 is mounted on the interposer substrate 11. In this case, the bumps 14 provided on the surface of the first chip 12 are abutted on the electrode pads of the interposer substrate 11 to thereby mount the first chip 12 on the interposer substrate 11.

Next, the base member 17 is disposed outside the first chip 12. The base member 17 is affixed to the interposer substrate 11 by an adhesive such as thermosetting resin. Then, the second chip 13 that is larger than the first chip 12 is mounted on the first chip 12. In this case, the second chip 13 is affixed on the first chip 12 by an adhesive or the like. In this instance, portions of the second chip 13 extending outside the first chip 12 are supported by the base member 17.

Then, the second chip 13 and the interposer substrate 11 are wire-bonded. Thereafter, the interposer substrate 11 on which the first chip 12 and the second chip 13 are mounted is molded using a sealing resin 16. Then, solder balls 18 that are used for mounting on a printed wire board are provided on the opposite side of the chip-mounting side of the interposer substrate 11.

As the second chip 13 is supported by the base member 17 in the manner described above, when the second chip 13 and the interposer substrate 11 are wire bonded, heat is sufficiently transferred to the second chip 13 through the base member 17, such that the heating of the second chip 13 is effectively conducted. Also, bonding pressure and ultrasonic energy that are applied to portions of the second chip 13 that extend outwardly from the first chip 12 can be alleviated. As a result, damage to the second chip 13 can be prevented.

Figure 2:
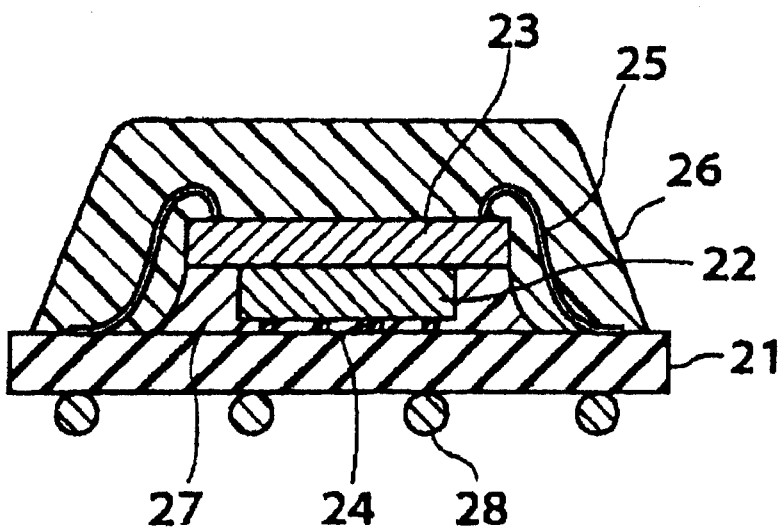
FIG. 2 shows a cross-sectional view of a structure of a semiconductor device in accordance with a second embodiment of the present invention.
Figure 3:
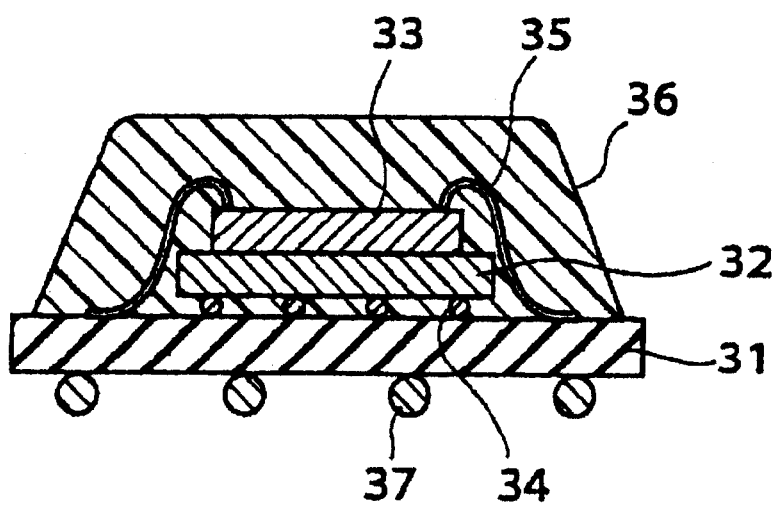
FIG. 3 shows a cross-sectional view of a structure of a conventional semiconductor device.

FIG. 2 shows a cross-sectional view of a structure of a semiconductor device in accordance with a second embodiment of the present invention.

Referring to FIG. 2, a plurality of electrode pads is formed on an interposer substrate 21. A first semiconductor chip 22 is flip-chip mounted on the electrode pads. In other words, bumps 24 are provided at locations corresponding to the electrode pads on the surface of the first chip 22, and the bumps 24 and the electrode pads are electrically connected to one another such that the first chip 22 is flip-chip mounted on the interposer substrate 21.

A second semiconductor chip 23 that has a larger measurement than that of the first chip 22 is mounted on the rear surface of the first chip 22. The second chip 23 is wire-bonded to the interposer substrate 21 by wires 25.

A filler layer 27 that is composed of a thermosetting resin or the like is provided as an undercoat layer between the first chip 22 and the second chip 23. In other words, the filler layer 27 is disposed at a location where it supports a portion of the second chip 23 that extends beyond the first chip 22.

In order to securely support the second chip 23, an area of the filler layer 27 to be located may preferably be generally the same as that of the first chip 22 or greater. It is noted that the filler layer 27 may preferably be composed of a material, for example, a non-conduction material such as a die-bonding material.

The first chip 22 and the second chip 23 are molded by a sealing resin 26. On the opposite side of the chip-mounting side of the interposer substrate 21, solder balls 28 that are connection members to be used for mounting on a printed wire board are provided. The stacked package and the printed wiring board are electrically connected by the solder balls 28.

Next, a method for manufacturing the semiconductor device having the structure described above is described below.

First, the first chip 22 is mounted on the interposer substrate 21. In this case, the bumps 24 provided on the surface of the first chip 22 are abutted on the electrode pads of the interposer substrate 21 to thereby mount the first chip 22 on the interposer substrate 21.

Then, the second chip 23 that is larger than the first chip 22 is mounted on the first chip 22. In this case, the second chip 23 is affixed on the first chip 22 by an adhesive or the like. Also, the filler layer 27 is provided between the second chip 23 and the interposer substrate 21, in other words, on an exterior side of the first chip 22 and between the first chip 22 and the second chip 23.

As the filler layer 27, a relatively low viscosity resin is initially used to fill the gap between the first chip 22 and the interposer substrate 21. By using a lower viscosity, the resin sufficiently penetrates in spite of the presence of the bumps 24. Then a resin that is adjusted at a relatively higher viscosity is used to fill areas around the exterior sides of the first chip 22 and the lower surface of the second chip 23. In this instance, areas of the second chip 23 that extend outwardly from the first chip 22 are supported by the filler layer 27. Alternatively, the filler layer can be provided at once without adjusting its viscosity.

Then, the second chip 23 and the interposer substrate 21 are wire-bonded. Thereafter, the interposer substrate 21 on which the first chip 22 and the second chip 23 are mounted is molded using a sealing resin 26. Then, solder balls 28 that are used for mounting to a printed wire board are provided on the opposite side of the chip-mounting side of the interposer substrate 21.

As the second chip 23 is supported by the filler layer 27 in the manner described above, heat is sufficiently transferred to the second chip 23 through the filler layer 27 when the second chip 23 and the interposer substrate 21 are wire-bonded, such that the heating of the second chip 23 is effectively conducted. Also, bonding pressure and ultrasonic energy that are applied to portions of the second chip 23 that extend outwardly from the first chip 22 can be alleviated. As a result, damage to the second chip 23 can be prevented.

In the first and second embodiments, the first chips 12 and 22 and the second chips 13 and 23 that are semiconductor elements may include SRAMs or the like.

The present invention is not limited to the embodiments described above, and many modifications can be made. For example, the materials and sizes of the members are not limited to the embodiments described above, and may be modified in many ways.

What is claimed is:

1. A semiconductor device comprising:
   a first semiconductor chip mounted on a substrate;
   a second semiconductor chip directly mounted on the first semiconductor chip with an adhesive, the second semiconductor chip extending beyond a perimeter of the first semiconductor chip; and
   a base member disposed between the second semiconductor chip and the substrate, said base member being laterally spaced apart from the first semiconductor chip;
   wherein the second semiconductor chip is supported by the base member.

2. A semiconductor device according to claim 1, wherein said second semiconductor chip includes peripheral portions extending beyond said perimeter of said first semiconductor chip which are supported by said base member.

3. A semiconductor device according to claim 1, wherein said base member further comprises a frame shaped member surrounding said first semiconductor chip.

4. A semiconductor device according to claim 1, wherein said base member further comprises columnar shaped members disposed about said perimeter of said first semiconductor chip.

5. A semiconductor device according to claim 1, wherein said second semiconductor chip is wire-bonded to said substrate.

6. The semiconductor device of claim 1 wherein a size of a surface area of said base member contacting said second semiconductor chip is substantially equal to a size of a surface area of the first semiconductor chip contacting said second semiconductor chip.

7. The semiconductor device of claim 1 wherein said base member includes a surface contacting said second semiconductor chip, a portion of said surface extending beyond an outboard edge of said second semiconductor chip.

8. The semiconductor device of claim 1 further comprising a sealing resin disposed between said base layer and said first semiconductor chip.

9. The semiconductor device of claim 1 wherein said base member has a coefficient of thermal expansion which is different from a coefficient of thermal expansion of at least one of said first and second semiconductor chips.

10. A semiconductor device comprising:
    a first semiconductor chip mounted on a substrate;
    a second semiconductor chip directly mounted on the first semiconductor chip with an adhesive, the second semiconductor chip extending beyond a perimeter of the first semiconductor chip; and
    a non-compliant filler layer provided between the second semiconductor chip and the substrate;
    wherein the second semiconductor chip is supported by the filler layer.

11. The semiconductor device of claim 10 wherein said filler layer further comprises a thermosetting resin.

12. The semiconductor device of claim 10 wherein said filler layer further comprises a non-conduction material.

13. The semiconductor device of claim 12 wherein said filler layer further comprises a die-bonding material.

14. The semiconductor device of claim 10 wherein a size of a surface area of said filler layer contacting said second semiconductor chip is substantially equal to a size of a surface area of the first semiconductor chip contacting said second semiconductor chip.

15. The semiconductor device of claim 10 wherein a size of a surface area of said filler layer contacting said second semiconductor chip is greater than a size of a surface area of the first semiconductor chip contacting said second semiconductor chip.

16. The semiconductor device of claim 10 wherein said filler layer includes a portion disposed between said first semiconductor chip and said substrate.

17. The semiconductor device of claim 16 wherein a viscosity of said portion of said filler layer disposed between said first semiconductor chip and said substrate is lower than a viscosity of another portion of said filler layer disposed outboard of said first semiconductor chip between said second semiconductor chip and said substrate.

* * * * *